(12) United States Patent
Kusada et al.

(10) Patent No.: US 9,247,668 B2
(45) Date of Patent: Jan. 26, 2016

(54) POWER CONVERTER DESIGNED TO MINIMIZE MECHANICAL VIBRATION OF CONVERTER COMPONENT

(71) Applicant: DENSO CORPORATION, Kariya, Aichi-pref. (JP)

(72) Inventors: Takashi Kusada, Nishio (JP); Tetsuya Hyakutake, Noshio (JP); Taijirou Momose, Kariya (JP)

(73) Assignee: DENSO CORPORATION, Kariya (JP)

( * ) Notice: Subject to any disclaimer, the term of this patent is extended or adjusted under 35 U.S.C. 154(b) by 125 days.

(21) Appl. No.: 14/245,547

(22) Filed: Apr. 4, 2014

(65) Prior Publication Data

US 2014/0301059 A1 Oct. 9, 2014

(30) Foreign Application Priority Data

Apr. 4, 2013 (JP) ................................. 2013-078530

(51) Int. Cl.
| | |
|---|---|
| *G06F 1/16* | (2006.01) |
| *H05K 7/14* | (2006.01) |
| *H05K 5/00* | (2006.01) |
| *H05K 7/00* | (2006.01) |
| *H01L 23/473* | (2006.01) |

(52) U.S. Cl.
CPC .................... *H05K 7/1432* (2013.01)

(58) Field of Classification Search
CPC .................. G06F 1/16; G06F 1/1601–1/1611; G06F 1/1613–1/1698; G06F 1/18–1/189; H05K 5/00–5/069; H05K 7/00–7/186; H01L 23/367–23/3677; H01L 23/473; H01L 23/46–23/467
USPC ............. 361/679.01–679.45, 679.55–679.61, 361/724–727; 455/575.1–575.9; 349/56–60; 312/223.1–223.3; 257/712–722, E23.088
See application file for complete search history.

(56) References Cited

U.S. PATENT DOCUMENTS

| | | | | |
|---|---|---|---|---|
| 2007/0109715 A1* | 5/2007 | Azuma | .................... | B60K 6/28 361/299.3 |
| 2007/0183130 A1* | 8/2007 | Yamabuchi | .......... | H05K 7/1432 361/728 |
| 2009/0086427 A1* | 4/2009 | Okumura | ................. | H05K 7/02 361/690 |
| 2009/0213314 A1 | 8/2009 | Azuma et al. | | |
| 2010/0155158 A1 | 6/2010 | Azuma et al. | | |
| 2010/0177487 A1* | 7/2010 | Arshad | .................... | G06F 21/86 361/737 |

(Continued)

FOREIGN PATENT DOCUMENTS

| | | |
|---|---|---|
| JP | 2007-143272 | 6/2007 |
| JP | 2009-201257 | 9/2009 |

*Primary Examiner* — Anthony Haughton
*Assistant Examiner* — Razmeen Gafur
(74) *Attorney, Agent, or Firm* — Nixon & Vanderhye P.C.

(57) ABSTRACT

A power converter includes a converter casing made of an assembly of a first case body and a second case body. The first case body has a bottom plate. The second case body has a top plate. Side plates are arranged between the top plate and the bottom plate. A capacitor is disposed in the converter casing and includes a capacitor casing and a capacitor device which is sealed with potting resin so as to have a potting surface through which the potting resin is exposed outside the capacitor casing. The capacitor is fixed on the bottom plate with the potting surface oriented perpendicular to a normal direction of the bottom plate. A connector is provided which mechanically connects the bottom plate and the top plate and is located away from the side plates, thereby enhancing the suppression of mechanical vibration of the capacitor on the bottom plate.

11 Claims, 12 Drawing Sheets

(56) References Cited

U.S. PATENT DOCUMENTS

| | | | |
|---|---|---|---|
| 2010/0320014 A1* | 12/2010 | Woody | B60L 11/00 180/65.8 |
| 2011/0007480 A1* | 1/2011 | Souda | B60K 6/28 361/728 |
| 2011/0051371 A1* | 3/2011 | Azuma | B60K 6/445 361/699 |
| 2011/0057713 A1* | 3/2011 | Kawanami | H01L 23/642 327/427 |
| 2011/0058342 A1* | 3/2011 | Kawakita | H01L 23/3135 361/735 |
| 2011/0096509 A1* | 4/2011 | Yoshimochi | H01L 23/3107 361/728 |
| 2011/0103024 A1* | 5/2011 | Frank | H01L 23/049 361/728 |
| 2011/0149467 A1 | 6/2011 | Azuma et al. | |
| 2011/0149625 A1 | 6/2011 | Azuma et al. | |
| 2011/0205724 A1* | 8/2011 | Nakajima | B60K 6/26 361/809 |
| 2011/0221268 A1* | 9/2011 | Kanazawa | H05K 1/0263 307/10.1 |
| 2011/0222244 A1* | 9/2011 | Takashiro | H02M 7/003 361/704 |
| 2011/0228508 A1* | 9/2011 | Inuduka | H02M 7/003 361/811 |
| 2011/0236235 A1* | 9/2011 | Hattori | B60H 1/3222 417/410.1 |
| 2011/0242770 A1* | 10/2011 | Yamanaka | H05K 7/1432 361/728 |
| 2011/0299265 A1* | 12/2011 | Nakatsu | B60L 11/14 361/820 |
| 2011/0310585 A1* | 12/2011 | Suwa | H01L 24/73 361/820 |
| 2011/0317373 A1* | 12/2011 | McDermid | H05K 1/144 361/730 |
| 2012/0008286 A1* | 1/2012 | Suzuki | B60L 11/14 361/730 |
| 2012/0008357 A1 | 1/2012 | Azuma et al. | |
| 2012/0057316 A1* | 3/2012 | Kaneshige | H01M 2/1072 361/752 |
| 2012/0087095 A1* | 4/2012 | Tokuyama | B60K 6/365 361/721 |
| 2012/0236519 A1* | 9/2012 | Chen | H05K 1/181 361/752 |
| 2012/0287582 A1* | 11/2012 | Vinciarelli | H01R 43/24 361/728 |

\* cited by examiner

POWER CONVERTER DESIGNED TO MINIMIZE MECHANICAL VIBRATION OF CONVERTER COMPONENT

CROSS REFERENCE TO RELATED DOCUMENT

The present application claims the benefit of priority of Japanese Patent Application No. 2013-78530 filed on Apr. 4, 2013, the disclosure of which is incorporated herein by reference.

BACKGROUND

1. Technical Field

This application relates generally to a power converter whose casing is made of an assembly of a first case and a second case and which has a capacitor mounted in a storage chamber defined inside the casing.

2. Background Art

Japanese Patent First Publication No. 2009-201257 discloses a power converter, such as an inverter mounted in electric vehicles or hybrid vehicles, which has a capacitor mounted within a converter casing. The capacitor is made of a capacitor casing and a capacitor device disposed in the capacitor casing and sealed with potting resin. The potting resin is partially exposed outside the capacitor casing to have a potting surface. The capacitor is mounted on a base with the potting surface facing the surface of the base.

Usually, the potting surface defines a major surface which is the greatest in area of the capacitor. Thus, the arrangement of the capacitor with the potting surface directly placed on the base will cause the capacitor to occupy a great area of a parts-mounting surface of the base, which requires a need for widening the parts-mounting surface of the base in order to secure an area for other parts. This leads to a difficulty in decreasing the size of the power converter in a planar direction of the capacitor.

In view of the above problem, it may be proposed to arrange the capacitor on the base with the potting surface oriented perpendicular to a normal direction of the base (i.e., a bottom of the converter casing) in order to make efficient use of a storage space in the casing and facilitate a decrease in size of the power converter. Such an orientation of the potting surface is also desirable in terms of simplicity of layout of terminals of the capacitor in the case where the terminals of the capacitor protrude from the potting surface and are joined to a switching circuit or a reactor arranged away from each other in the planar direction of the bottom of the casing.

The arrangement of the capacitor with the potting surface oriented perpendicular to the planar direction of the bottom of the converter casing, however, may result in a problem that facilitates the physical vibration of the capacitor. Specifically, the mounting of the capacitor on the converter casing is achieved by securing the capacitor casing to the bottom of the converter casing. It is usually impossible to secure an area for the securement of the capacitor casing on the potting surface. The capacitor casing is, therefore, fixed on an area of the bottom of the capacitor casing other than the potting surface. It is difficult for such an arrangement of the capacitor casing to avoid the physical vibrations of the capacitor in a direction in which the capacitor leans toward the potting surface when the power converter is subjected to mechanical vibrations. For instance, when the vehicle vibrates, it may increase the vibrations of the capacitor toward the potting surface, which results in an increase in physical load on terminals of the capacitor which connect with other parts.

SUMMARY

It is therefore an object of this disclosure to provide an improved structure of a power converter which is designed to minimize the mechanical vibration of a capacitor installed in the power converter.

According to one aspect of an embodiment, there is provided a power converter which may be employed in automotive vehicles such as electric cars or hybrid cars. The power converter comprises: (a) a converter casing which is made of an assembly of a first case body and a second case body and has a storage chamber defined therein, the first case body including a bottom plate, the second case body including a top plate which faces the bottom plate, at least one of the first case body and the second case body having side plates which extend from a corresponding one of the bottom plate and the top plate to the other; (b) a capacitor which is secured to the bottom plate within the storage chamber of the converter casing, the capacitor including a capacitor casing and a capacitor device which is disposed within the capacitor casing and sealed with potting resin so as to have a potting surface through which the potting resin is exposed outside the capacitor casing, the capacitor being fixed on the bottom plate with the potting surface oriented perpendicular to a normal direction of the bottom plate; and (c) a connector which mechanically connects the bottom plate of the first case body and the top plate of the second case body and is located away from the side plates.

Specifically, the connector works to establish a mechanical joint of the bottom plate and the top plate of the converter casing at a location away from the side plates, thereby enhancing the suppression of mechanical vibration of the bottom plate.

The inventors of this application have found that a major cause of mechanical vibration of the capacitor resides on mechanical vibration of the bottom plate of the first case body which arises from deformation thereof. Specifically, the exertion of vibration, as transmitted to the power converter, on the capacitor causes stress to be transferred from the joint of the capacitor to the bottom plate. Such stress will result in the deformation of the bottom plate, which leads to the vibration of the capacitor fixed on the bottom plate in the converter casing.

In order to alleviate the above problem, the power converter is designed to have the connector which mechanically joints the bottom plate of the first case body and the top plate of the second case body together and is located apart from the side plates of the converter casing. In other words, the connector is provided on a portion of the bottom plate which is relatively lower in stiffness and is separate from the side plates. Such a location is effective in decreasing the deformation of the bottom plate, thus resulting in a decrease in vibration of the capacitor mounted on the bottom plate. This also decreases the degree of stress acting on terminals of the capacitor which are connected to another component of the power converter.

BRIEF DESCRIPTION OF THE DRAWINGS

The present invention will be understood more fully from the detailed description given hereinbelow and from the accompanying drawings of the preferred embodiments of the invention, which, however, should not be taken to limit the invention to the specific embodiments but are for the purpose of explanation and understanding only.

In the drawings.

DESCRIPTION OF THE PREFERRED EMBODIMENTS

Figure 1:
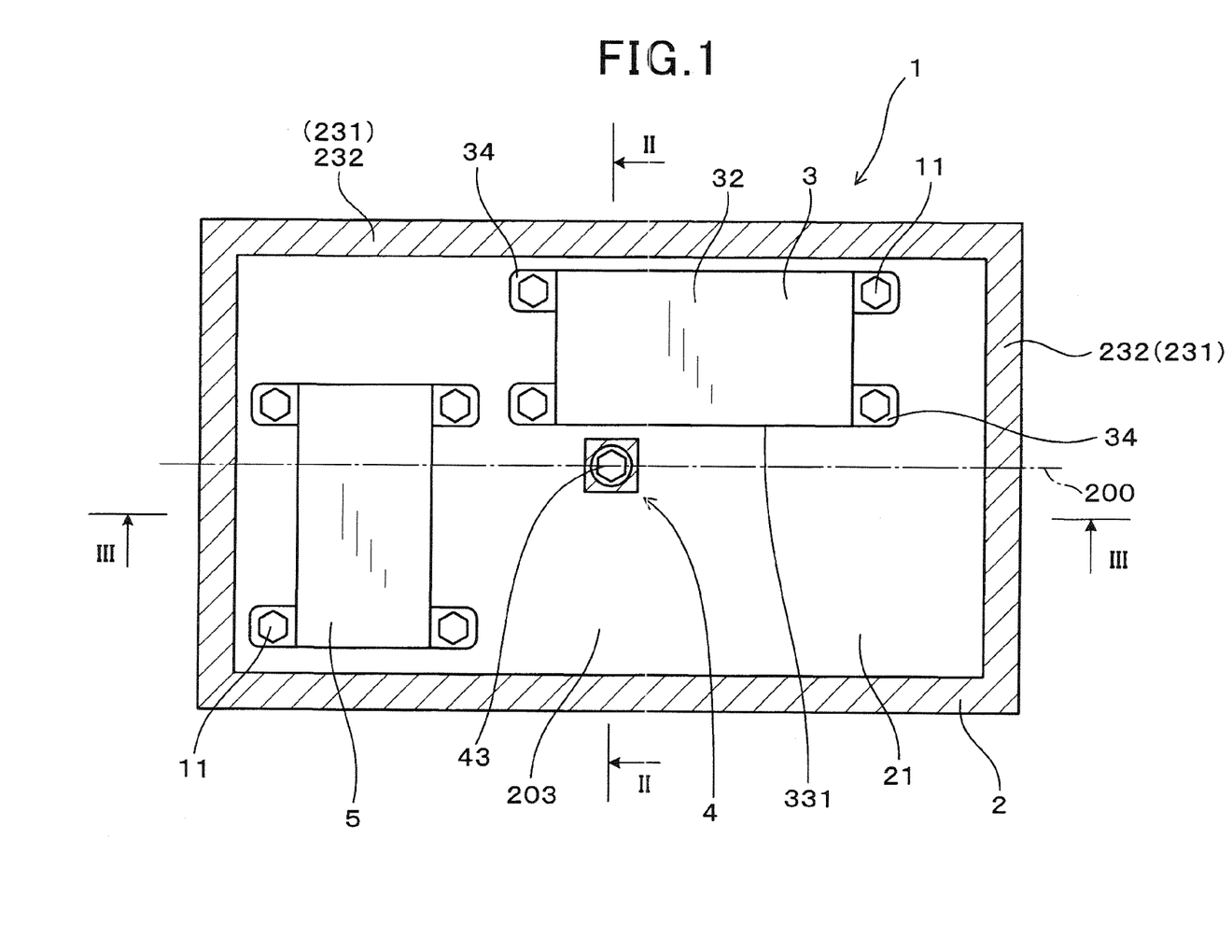
FIG. 1 is a partially sectional plane view which illustrates a power converter according to the first embodiment.
Figure 2:
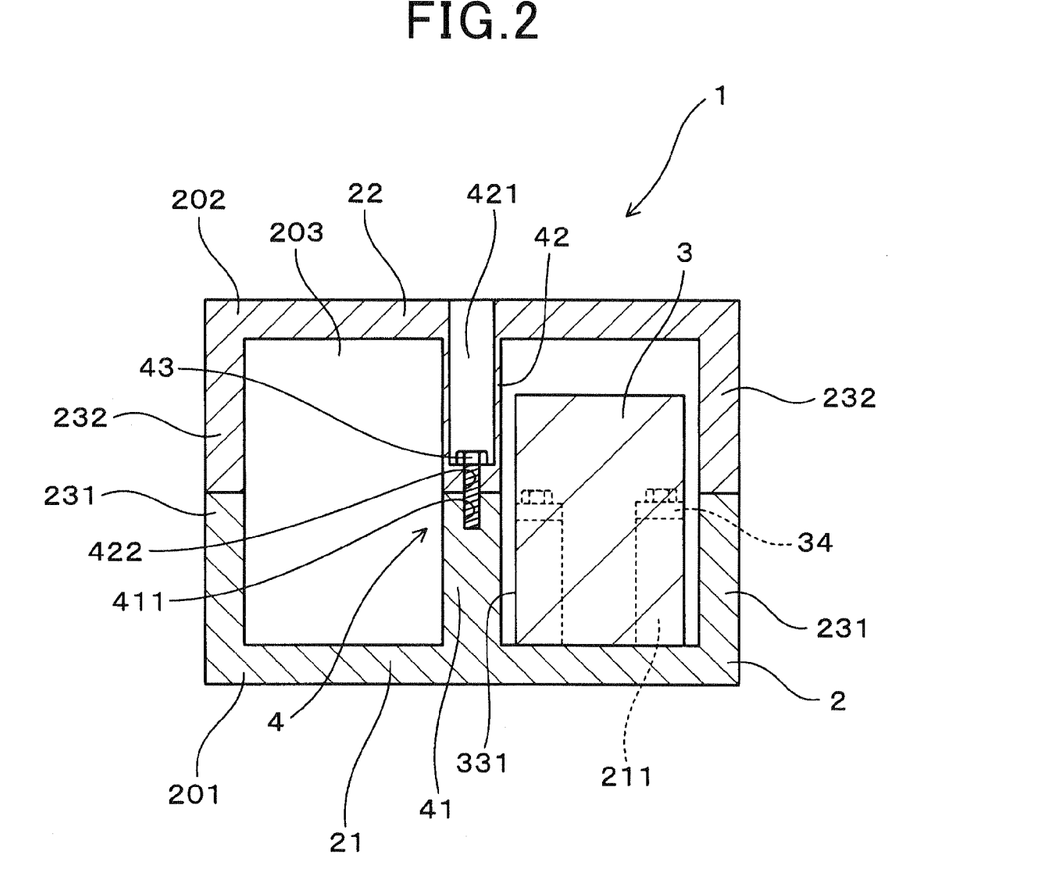
FIG. 2 is a sectional view taken along the line II-II in FIG. 1.
Figure 3:
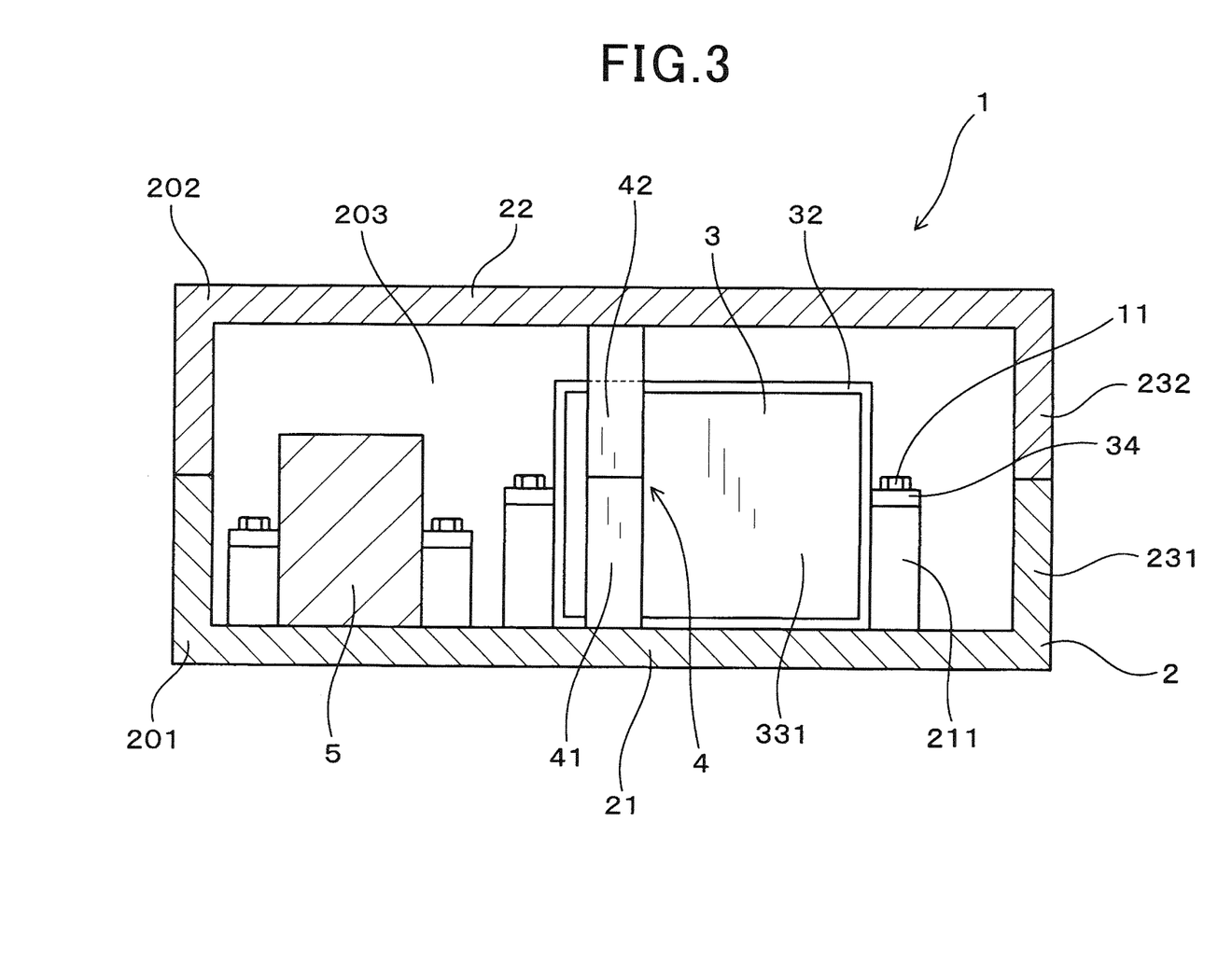
FIG. 3 is a sectional view taken along the line III-III in FIG. 1.

Referring to the drawings, wherein like reference numbers refer to like parts in several views, particularly to FIGS. 1 to 4, there is shown a power converter 1 according to the first embodiment which may be mounted in automotive vehicles such as electric vehicles or hybrid vehicles. The power converter 1 is, as illustrated in FIGS. 1 to 3, equipped with a converter casing 2 and a capacitor 3. The converter casing 2 is made of an assembly of a first case body 201 and a second case body 202 and has a storage chamber 203 defined therein. The capacitor 3 is disposed in the storage chamber 203.

The first case body 201, as illustrated in FIGS. 2 and 3, has a bottom plate 21 to which the capacitor 3 is secured. The second case body 202 is equipped with a top board or plate 22 facing the bottom plate 21. The first case body 201 has side plates 231 which extend from the bottom plate 21 toward the top plate 22 of the second case body 202. Similarly, the second case body 202 has side plates 232 which extend from the top plate 22 toward the bottom plate 21 of the first case body 201.

Figure 4:
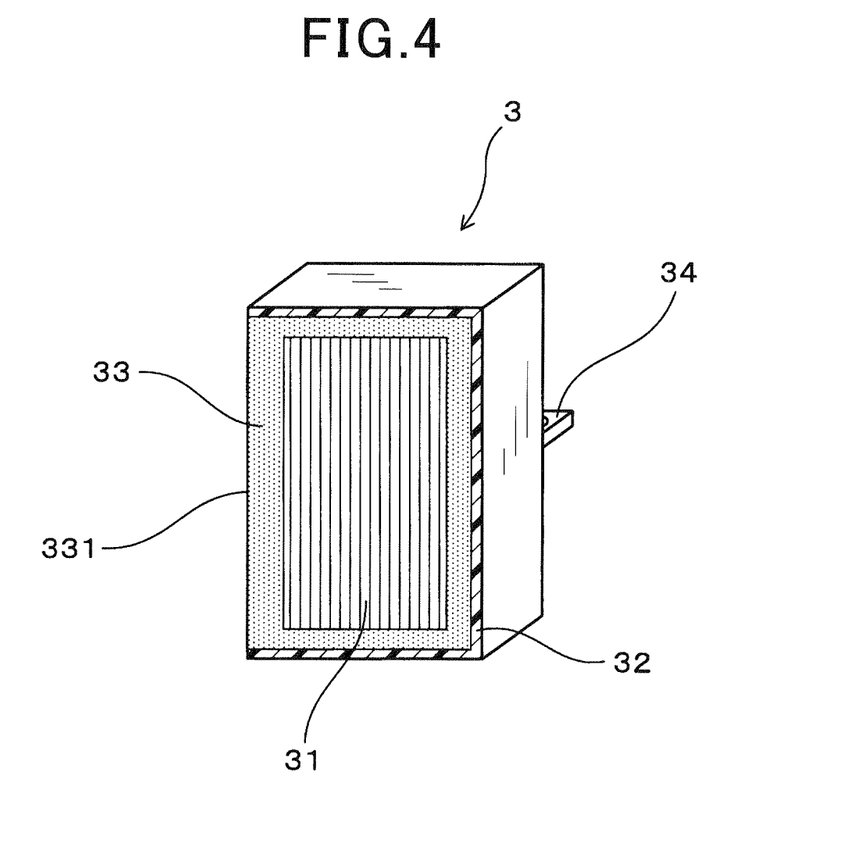
FIG. 4 is a perspective sectional view of a capacitor mounted in the power converter of FIG. 1.

FIG. 4 is a longitudinal perspective sectional view which illustrates the capacitor 3. The capacitor 3 is, as clearly illustrated in FIG. 4, made of an assembly of a capacitor device 31, a potting resin 33, and a capacitor casing 32. Specifically, the capacitor device 31 is disposed within the capacitor casing 32 and sealed with the potting resin 33. The capacitor 3 has a potting surface 331 that is one of outer surfaces thereof and through which the potting resin 33 is exposed outside the capacitor casing 32. The capacitor 3 is, as can be seen from FIGS. 1 to 3, fixed on the bottom plate 21 with the potting surface 331 oriented perpendicular to the normal direction (i.e., a direction of a normal line) of the bottom plate 21.

The converter casing 2 has connector 4 which firmly joints the bottom plate 21 of the first case body 201 and the top plate 22 of the second case body 202. The connector 4 is located apart from the side plates 231 and 232.

The capacitor 3 is, as can be seen from the perspective sectional view in FIG. 4, of a rectangular parallelepiped shape. Specifically, the capacitor casing 32 is cuboid and has an open surface that is the greatest in area among side surfaces thereof. The potting resin 33 is exposed from the open surface of the capacitor casing 32 to make the potting surface 331. The potting surface 331, therefore, has an area that is the greatest among all the outer surfaces of the capacitor 3 (i.e., the capacitor casing 32).

The capacitor 3, as illustrated in FIGS. 1 and 3, has four flanges 34 protruding from the capacitor casing 32. Specifically, the flanges 34 extend from the side surfaces of the capacitor casing 32 which are perpendicular to the potting surface 331 in a direction parallel to the potting surface 331. More specifically, each of the flanges 34 is located at substantially the middle of one of the side surfaces of the capacitor casing 32 in a height-wise direction of the capacitor casing 32 and protrudes laterally therefrom. Two of the flanges 34 are located closer to the potting surface 331, while the other two are located closer to the side wall of the capacitor casing 32 which is opposed to the potting surface 331.

The joining of the capacitor 3 to the bottom plate 21 of the first case body 201 is achieved by putting the four flanges 34 on tops of bosses (i.e., cylindrical supports) 211 extending from the bottom plate 21 of the first case body 201 and fastening bolts 11 into the bosses 211 through the flanges 34.

The connector 4 is, as illustrated in FIGS. 1 and 2, disposed between a plane extending over the potting surface 331 of the capacitor 3 and the side plates 231 and 232 which directly face the potting surface 331. In this embodiment, the connector 4 is so located as to face the potting surface 331 of the capacitor 3.

The capacitor 3 is oriented to have the potting surface 331 facing the center of the converter casing 2 in the normal direction of the potting surface 331. Specifically, the capacitor 3 is arranged along longer sides of the storage chamber 203 (i.e., the side plates 231 and 232 of the converter casing 2), as viewed from the normal direction of the bottom plate 21. In other words, the capacitor 3 has a length extending substantially parallel to the length of the converter casing 2. If the storage chamber 203 of the converter casing 2 is divided by a longitudinal center line 200 into two halves, the capacitor 3 is disposed in one of the two halves. The potting surface 331 faces the center of the storage chamber 203 (i.e., the center of the converter casing 2) in a direction in which shorter sides of the storage chamber 203 extends (i.e., a direction perpendicular to the longitudinal center line 200, that is, the normal direction of the potting surface 331).

The connector 4 is, as described above, so located as to face the potting surface 331. The connector 4 is, as illustrated in FIGS. 2 and 3, made up of a first boss 41, a second boss 42, and a fastener (i.e., a bolt) 43. The first boss 41 extends from the bottom plate 21 toward the top plate 22. The second boss 42 extends from the top plate 22 toward the bottom plate 21. The bolt 43 joints the first and second bosses 41 and 42 together. The first boss 41 has an internal thread 411. The second boss 42 has a cylindrical recess or cavity 421 with an opening at the outer surface of the top plate 22. The second boss 42 also has a hole 422 passing through the bottom thereof. The bolt 43 is inserted into the hole 422 through the cavity 421 and then fastened to engage the internal thread 411 of the first boss 41, thereby joining the first and second bosses 41 and 42 together, which creates a firm joint between the bottom plate 21 and the top plate 22.

As viewed in the normal direction of the bottom plate 21 in FIG. 1, the connector 4 is located substantially at the center of the storage chamber 203 in either of the directions in which the longer sides of the storage chamber 203 extend and in which the shorter sides of the storage chamber 203 extend. In other words, the centers of major areas of the bottom plate 21 and the top plate 22 are joined together by the connector 4.

The first case body 201 and the second case body 202 are joined together at mating faces thereof using a plurality of fasteners (not shown), such as bolts, disposed around outer peripheries of the mating faces, thereby completing the converter casing 2.

The power converter 1 also has different types of parts other than the capacitor 3 installed within the storage chamber 203. For instance, a noise filter 5 which works to remove electromagnetic noise from electric power inputted into or outputted from the power converter 1 is, as illustrated in FIGS. 1 and 3, installed in the storage chamber 203. The noise filter 5 is fixed on the bottom plate 21 of the first case body 201 through bolts 11. FIG. 2 omits the noise filter 5 for the simplicity of illustration. The same is true for FIG. 6 and following figures.

Although not illustrated, the power converter 1 also includes a semiconductor module(s), a cooler and a control circuit board disposed in the storage chamber 203. The semiconductor module works as a power converting device to execute a main operation of the power converter 1. The cooler serves to cool the semiconductor module. The control circuit board has mounted thereon a driver or controller to control a switching operation of the semiconductor module.

The power converter 1, as described above, may be mounted in automobiles, such as electric vehicles or hybrid vehicles, to drive the automobiles.

The beneficial effects, as provided by the above structure of the power converter 1, will be described below.

The converter casing 2 is, as described above, equipped with the connector 4 which is used as a securing/joining member to establish a mechanical joint of the bottom plate 21 and the top plate 22 at a location away from the side plates 231 and 232, thereby suppressing the physical vibration of the capacitor 3.

A major factor in vibration of the capacitor 3 within the converter casing 2 is thought of as deformation-caused vibration of the bottom plate 21 of the first case body 201 to which the capacitor 3 is secured. Specifically, the exertion of vibration, as transmitted to the power converter 1, on the capacitor 3 causes stress to be transferred from the joint of the capacitor 3 to the bottom plate 21. Such stress will result in the deformation of the bottom plate 21, which leads to the vibration of the capacitor 3 fixed on the bottom plate 21 in the converter casing 2.

In order to alleviate the above problem, the power converter 1 is designed to have the connector 4 which mechanically joints the bottom plate 21 of the first case body 201 and the top plate 22 of the second case body 202 together and is located apart from the side plates 231 and 232 of the converter casing 2. In other words, the connector 4 is provided on a portion of the bottom plate 21 which is usually lower in stiffness and is away from the side plates 231 and 232. Such a location is effective in decreasing the deformation of the bottom plate 21, thus resulting in a decrease in vibration of the capacitor 3 mounted on the bottom plate 21. This also decreases the degree of stress acting on the terminals of the capacitor 3 which are connected to, for example, the noise filter 5 in the power converter 1.

The capacitor 3 is designed to have the potting surface 331 which is the widest in area among the outer surfaces thereof, thereby resulting in a decrease in planar area of the bottom plate 21 occupied by the capacitor 3. This enables the power converter 1 to be reduced in size. The connector 4 also serves to minimize the risk that the potting surface 331 of the capacitor 3 leans downward, thereby enhancing the suppression of vibration of the capacitor 3.

The connector 4 is, as described already, disposed between a plane including the potting surface 331 of the capacitor 3 and one of the side walls of the capacitor casing 2 which directly faces the potting surface 331. Such one of the side walls of the capacitor casing 32 is defined by one of the side plates 231 and a corresponding one of the side plates 232 which is joined to the one of the side plates 231. The connector 4 is also located so as to directly face the potting surface 331 of the capacitor 3. This results in an increased degree of rigidity of the bottom plate 21 against the stress which is exerted on the bottom plate 21 when the potting surface 331 of the capacitor 3 leans downwardly, thus enhancing the suppression of vibration of the capacitor 3.

Figure 5:
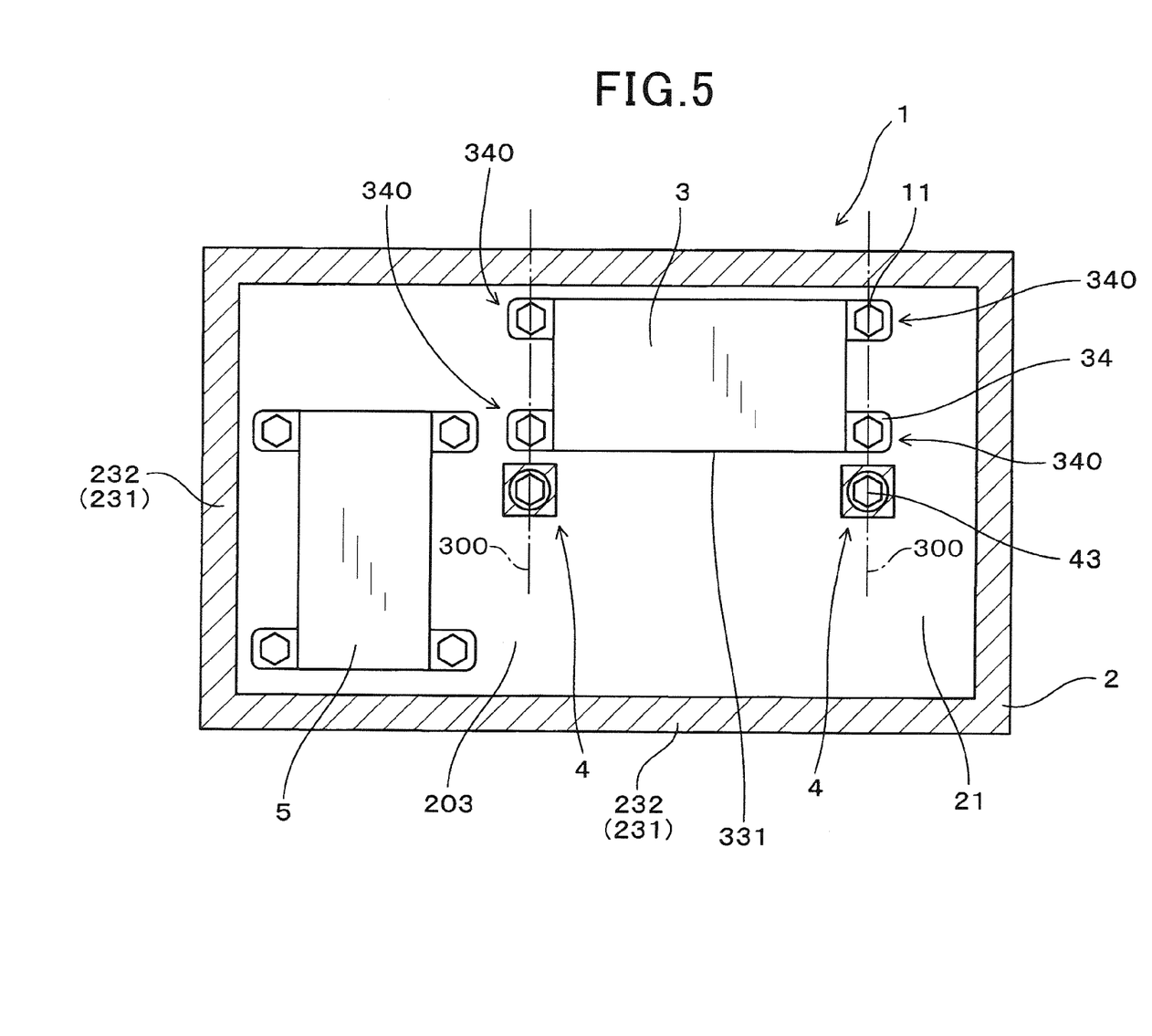
FIG. 5 is a partially sectional plane view which illustrates a power converter according to the second embodiment.

The second embodiment will be described below with reference to FIG. 5.

The capacitor 3 is, like in the first embodiment, secured to the bottom plate 21 of the converter casing 2 through four fixing points or joints 340. Each of the joints 340 is used as a capacitor fastener and made up of the flange 34, the boss 211, and the bolt 11. The bottom plate 21 of the first case body 201 and the top plate 22 of the second case body 202 are mechanically joined together through two connectors 4. If lines passing through the centers of the joints 340 in parallel to the normal line of the potting surface 331 of the capacitor 3 are, as illustrated in FIG. 5, denoted by 300, each of the connectors 4 lies on one of the lines 300, as viewed from the normal direction of the bottom plate 21. In other words, the center of each of the joints 340 and the center of a nearer one of the connectors 4 are aligned with a line extending perpendicular to the potting surface 331 of the capacitor 3.

The capacitor 3 is, as described above, fixed to the bottom plate 21 of the converter casing 2 through the four joints 340. Specifically, the capacitor 3, like in the first embodiment, has four flanges 34, two protruding from one of opposed side surfaces of the capacitor casing 32. Each of the joints 340 of the capacitor 3 is created by a portion of one of the flanges 34 secured to the bottom plate 21 of the first case body 201 using the bolt 11.

More specifically, the lines 300 are so defined as to extend in the normal direction of the potting surface 331 of the capacitor 3 through two of the joints 340 of the capacitor 3 which are closer to the potting surface 331 than the others are. Each of the connectors 4 is located on one of the lines 300. In case of the geometrical structure of the capacitor 3 in FIG. 5, each of the lines 300 additionally passes through one of two of the joints 340 which are farther away from the potting surface 331 than the other two. Two of the joints 340 which lie on the same side surface of the capacitor 3 and one of the connectors 4 are aligned with each other in the normal direction of the potting surface 331 in this embodiment, but however, either of the two of the joints 340 which lie on the same side surface of the capacitor 3 may be aligned with one of the connectors 4 along the line 300. It is preferable that each of the connectors 4 is located on the line 300 extending through one of the joints 340 which is closer to the potting surface 331. Each of the connectors 4 is arranged closer to one of the joints 340 which is closer to the potting surface 331.

Other arrangements are identical with those in the first embodiment. The same reference numbers, as employed in the first embodiment, refer to the same parts, and explanation thereof in detail is omitted here.

The structure of the power converter 1 in the second embodiment serves to avoid the deformation of the bottom plate 21 which arises from the stress exerted from the joints 340 to the bottom plate 21, thus minimizing the vibration of the capacitor 3.

Figure 6:
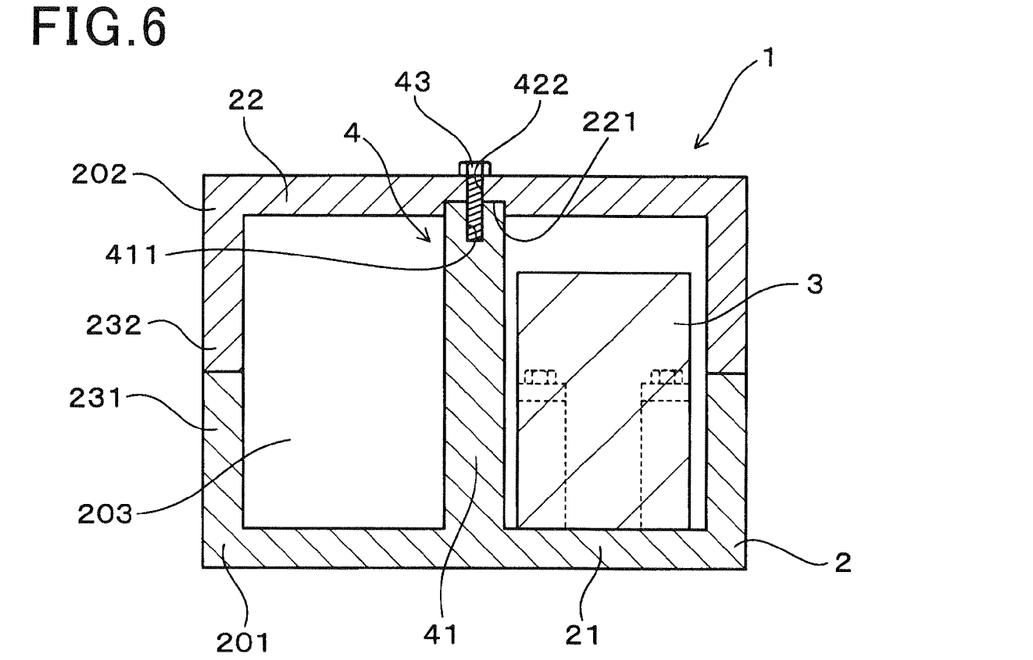
FIG. 6 is a vertical sectional view which shows a power converter according to the third embodiment.

The third second embodiment will be described below with reference to FIG. 6.

The power converter 1 of this embodiment is different from the one in the first embodiment in that the first boss 41 of the connector 4 is designed to be longer than the first embodiment in the vertical direction of the converter casing 2.

Specifically, the first boss 41 extends from the bottom plate 21 of the first case body 201 to be longer than the side plates 231 (i.e., the height of the inner walls of the side plates 231) so that the top thereof enters the top plate 22. The connector 4 does not have the second boss 42. The top plate 22 of the converter casing 2 has formed in the inside wall thereof a cylindrical recess 221 in which the top of the first boss 41 is fit. The top plate 22 also has a through hole 422 exposed inside the recess 221.

When the second case body 202 is joined to the first case body 201, the top of the first boss 41 will be inserted into the recess 221 and then placed in contact abutment with the top plate 22. The firm joint of the top plate 22 to the bottom plate 21 is then achieved by inserting the bolt 43 into the through hole 422 and fastening it to establish engagement with the internal thread 411.

Other arrangements are identical with those in the first embodiment. The same reference numbers, as employed in the first embodiment, refer to the same parts, and explanation thereof in detail is omitted here.

The structure of the power converter 1 in the third embodiment provides a simpler structure of the second case body 202 as compared with the first embodiment.

The fourth embodiment will be described below with reference to FIG. 7 which is a modification of the first embodiment.

Figure 7:
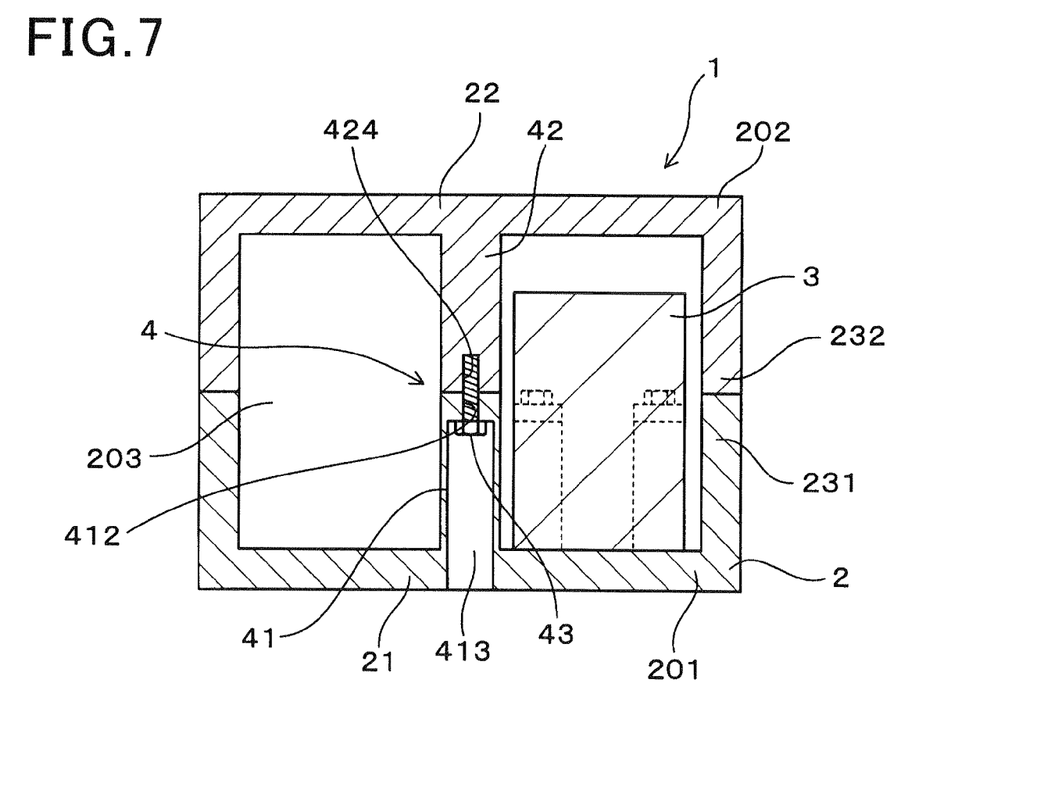
FIG. 7 is a vertical sectional view which shows a power converter according to the fourth embodiment.

The structures of the first boss 41 and the second boss 42 of the connector 4 are, as can be seen from FIG. 7, opposite to those in the first embodiment. Specifically, the first boss 41 of the first case body 201 has a cylindrical recess or cavity 413 with an opening at the outer surface of the bottom plate 21. The first boss 41 has a hole 412 passing through the bottom thereof. The second boss 42 of the second case body 202 has an internal thread 424. The bolt 43 is fastened into the second boss 42 from the first boss 41 to establish a firm joint between the first boss 41 and the second boss 42.

Other arrangements are identical with those in the first embodiment. The same reference numbers, as employed in the first embodiment, refer to the same parts, and explanation thereof in detail is omitted here.

The fifth embodiment will be described below with reference to FIG. 8 which is a modification of the first embodiment.

The second case body 202 does not have the side plates 232, in other words, it is shaped as a flat plate. The first case body 201 is designed to have the side plates 231 higher than those in the first embodiment. In other words, each of the side plates 231 corresponds to a combination of the side plate 231 and the side plate 232 in the first embodiment. The first boss 41 of the first case body 201 extends from the bottom plate 21 to have the same height as that of the side plates 231.

When the first case body 201 and the second case body 202 are fitted together, the tops of the side plates 231 will be placed in contact abutment with the major surface of the second case body 202. Simultaneously, the top of the first boss 41 is also put in contact abutment with the major surface of the second case body 202. The firm joint of the top plate 22 to the bottom plate 21 is then achieved by inserting the bolt 43 into the through hole 422 and fastening it to establish engagement with the internal thread 411 formed in the first boss 41.

Other arrangements are identical with those in the first embodiment. The same reference numbers, as employed in the first embodiment, refer to the same parts, and explanation thereof in detail is omitted here.

The structure of the power converter 1 in the fifth embodiment provides a simple structure of the second case body 202 as compared with the first embodiment.

Figure 8:
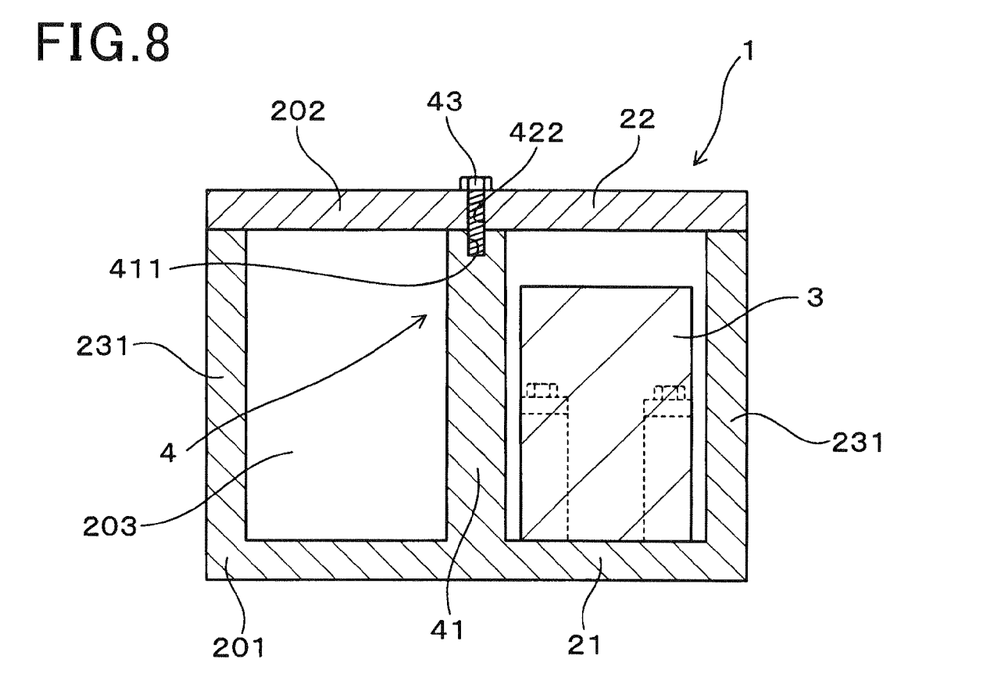
FIG. 8 is a vertical sectional view which shows a power converter according to the fifth embodiment.

The structures of the first case body 201 and the second case body 202 may be shaped to be opposite to those in FIG. 8. Specifically, the first case body 201 may be formed by a flat plate, while the second case body 202 may be designed to have the same configuration as that of the first case body 201 in FIG. 8.

Figure 9:
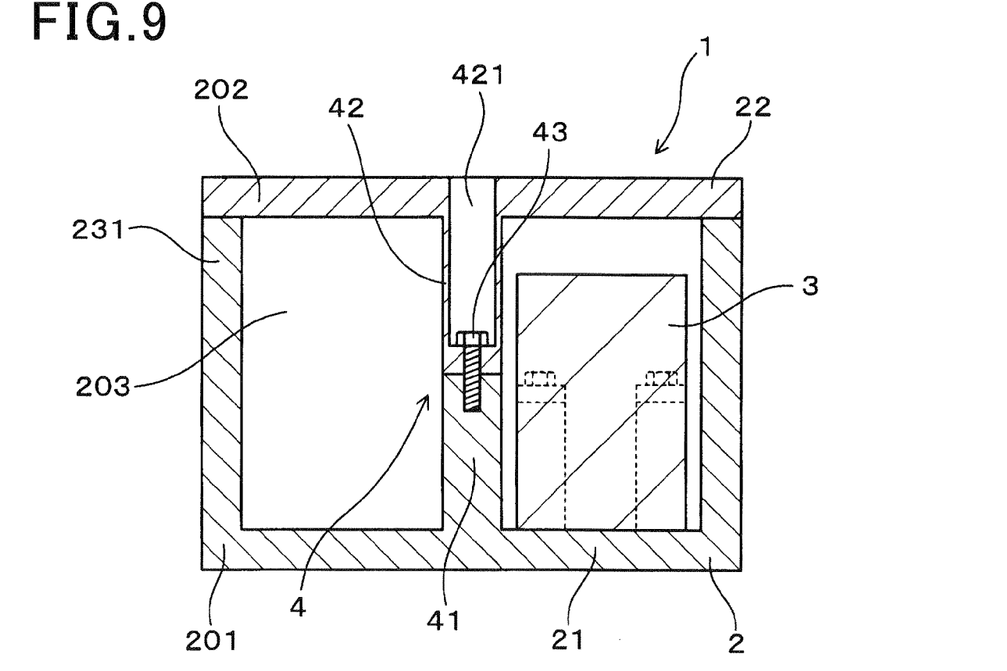
FIG. 9 is a vertical sectional view which shows a power converter according to the sixth embodiment.

The sixth embodiment will be described below with reference to FIG. 9 which is a combination of the first embodiment and the second embodiment.

Specifically, the connector 4, like in the first embodiment, includes the first boss 41 and the second boss 42. The first boss 41 extends from the first case body 201. The second boss 42 extends from the second case body 202.

The second case body 202 is shaped as a flat plate and has substantially the same configuration as that in the fifth embodiment of FIG. 8 other than the second boss 42. The first case body 201 is shaped to have substantially the same configuration as that in the fifth embodiment other than the length of the first boss 41.

Other arrangements are identical with those in the first embodiment. The same reference numbers, as employed in the first and firth embodiments, refer to the same parts, and explanation thereof in detail is omitted here.

Figure 10:
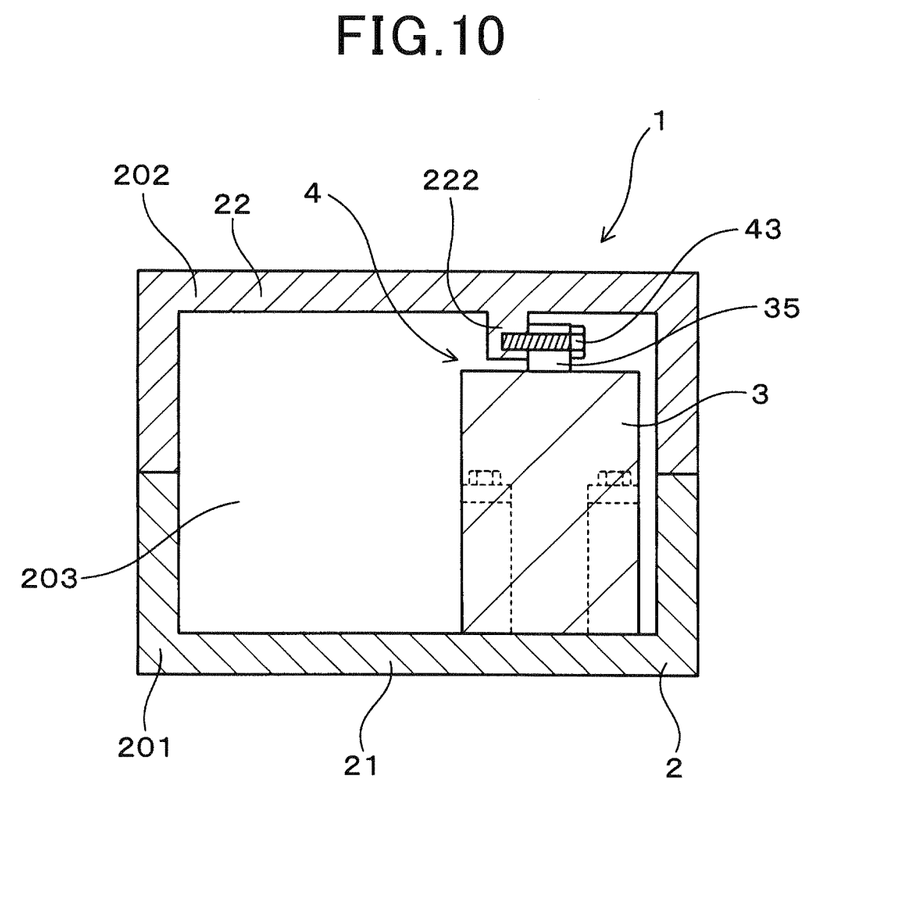
FIG. 10 is a vertical sectional view which shows a power converter according to the seventh embodiment.

The seventh embodiment will be described below with reference to FIG. 10 which is different from the first embodiment in that the connector 4 is partially formed by the capacitor 3.

Specifically, the power converter 1 is designed to have the capacitor 3 joined to the top plate 22 of the second case body 202 in addition to the bottom plate 21 of the first case body 201 to make the connector 4.

More specifically, the capacitor 3 has a flange 35 formed on the top surface facing the top plate 22 of the second case body 202. Similarly, the top plate 22 has a flange 222. The joint of the capacitor 3 to the top plate 22 is achieved by connecting the flange 35 of the capacitor 3 and the flange 222 of the top plate 22 together through a bolt 43, thereby joining the top plate 22 of the second case body 202 and the bottom plate 21 of the first case body 201 together to complete the converter casing 2.

Other arrangements are identical with those in the first embodiment. The same reference numbers, as employed in the first embodiment, refer to the same parts, and explanation thereof in detail is omitted here.

The structure of the converter casing 2 is useful in suppressing the vibration of the capacitor 3 without sacrificing the volume of the storage chamber 203 in the converter casing 2.

Figure 11:
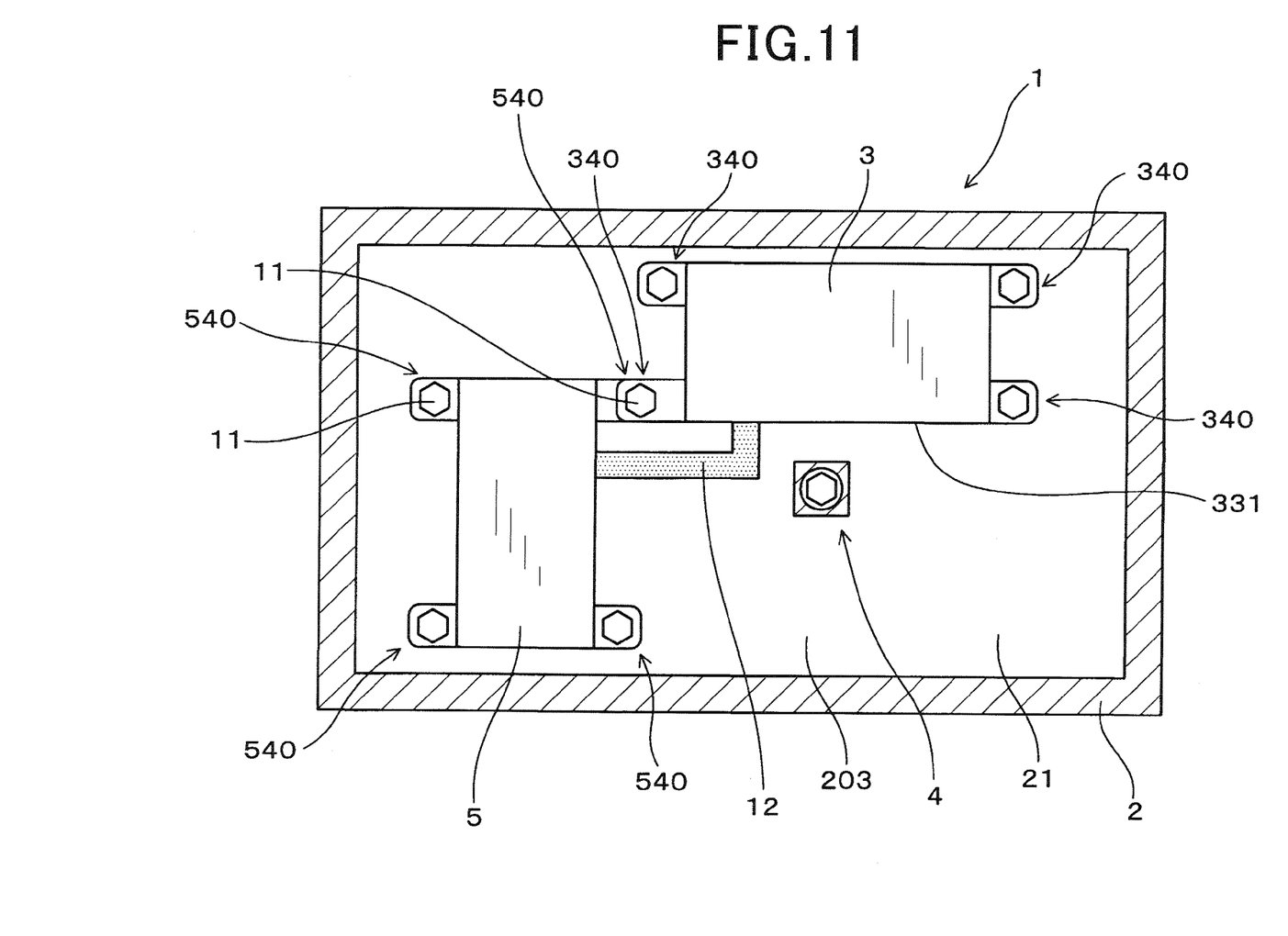
FIG. 11 is a partially sectional plane view which illustrates a power converter according to the eighth embodiment.

The eighth embodiment will be described below with reference to FIG. 11 which is different from the first embodiment in that one of fixing points or joints 540 of the noise filter 5 to the bottom plate 21 of the first case body 201 is also connected to one of the joints 340 of the capacitor 3 to the bottom plate 21.

Specifically, the noise filter 5 is mounted on the bottom plate 21 in addition to the capacitor 3. The noise filter 5 is coupled to the capacitor 3 through a bus bar 12. The noise filter 5 is fixed to the bottom plate 21 through the joints 540. The joints 540 are used as converter-component fasteners to fasten the noise filter 5 (i.e., a converter component) to the converter casing 2. One of the joints 540 is mechanically fastened to one of the joints 340 which are, as described above, used as capacitor fasteners to secure the capacitor 3 to the bottom plate 21.

The noise filter 5 is, as described above, joined to the capacitor 3 through the bus bar 12 and also secured to the bottom plate 21 by the bolts 11 at the joints 340. One of the four joints 540 of the noise filter 5 which is closest to the bus bar 12 is mechanically secured to one of the four joints 340 of the capacitor 3 which is closest to the bus bar 12 using one of the bolts 11.

Other arrangements are identical with those in the first embodiment. The same reference numbers, as employed in the first embodiment, refer to the same parts, and explanation thereof in detail is omitted here.

Figure 12:
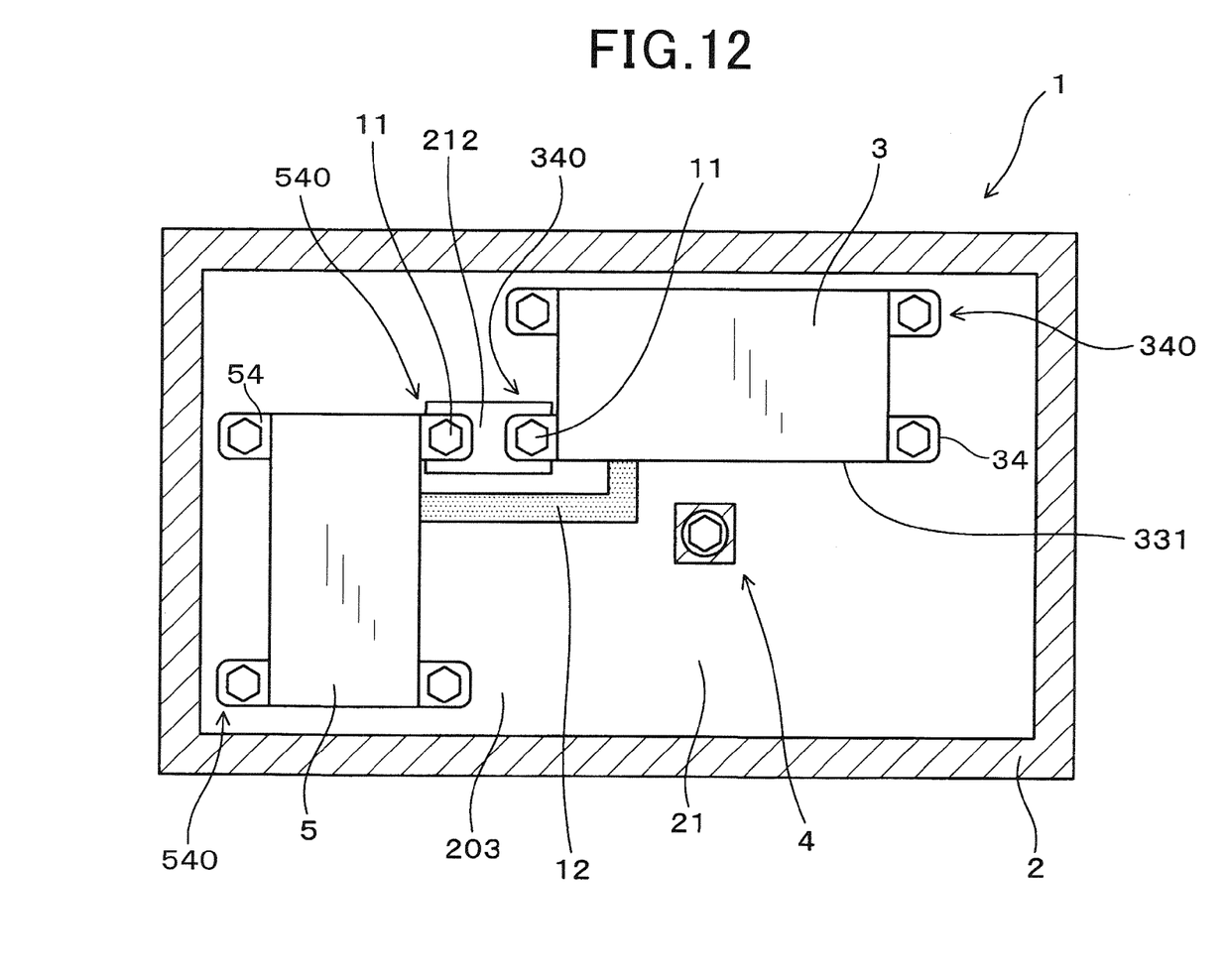
FIG. 12 is a partially sectional plane view which illustrates a power converter according to the ninth embodiment.

The ninth embodiment will be described below with reference to FIG. 12 which is a modification of the eighth embodiment in which one of the joints 540 of the noise filter 5 and one of the joints 340 of the capacitor 3 are firmly secured to a rectangular base 212.

The base 212 has a given thickness protruding from its surrounding surface of the bottom plate 21 (i.e., the major surface of the bottom plate 21) and is secured to or formed integrally with the bottom plate 21. One the joints 540 and one of the joints 340 which are located adjacent each other are fastened to the common base 212. Specifically, one of the flanges 54 of the noise filter 5 and one of the flanges 34 of the capacitor 3 are joined to the base 212 through the bolts 11, respectively.

Other arrangements are identical with those in the first embodiment. The same reference numbers, as employed in the first embodiment, refer to the same parts, and explanation thereof in detail is omitted here.

The use of the base 212 secures good stability in connecting the joints 540 and the 340 together and to the bottom plate 21.

The tenth embodiment will be described below with reference to FIGS. 13 and 14 which is a modification of the ninth embodiment of FIG. 12 in which the bus bar 12 is fastened to the bottom plate 21 along with either or both one of the joints 540 of the noise filter 5 and one of the joints 340 of the capacitor 3.

Figure 13:
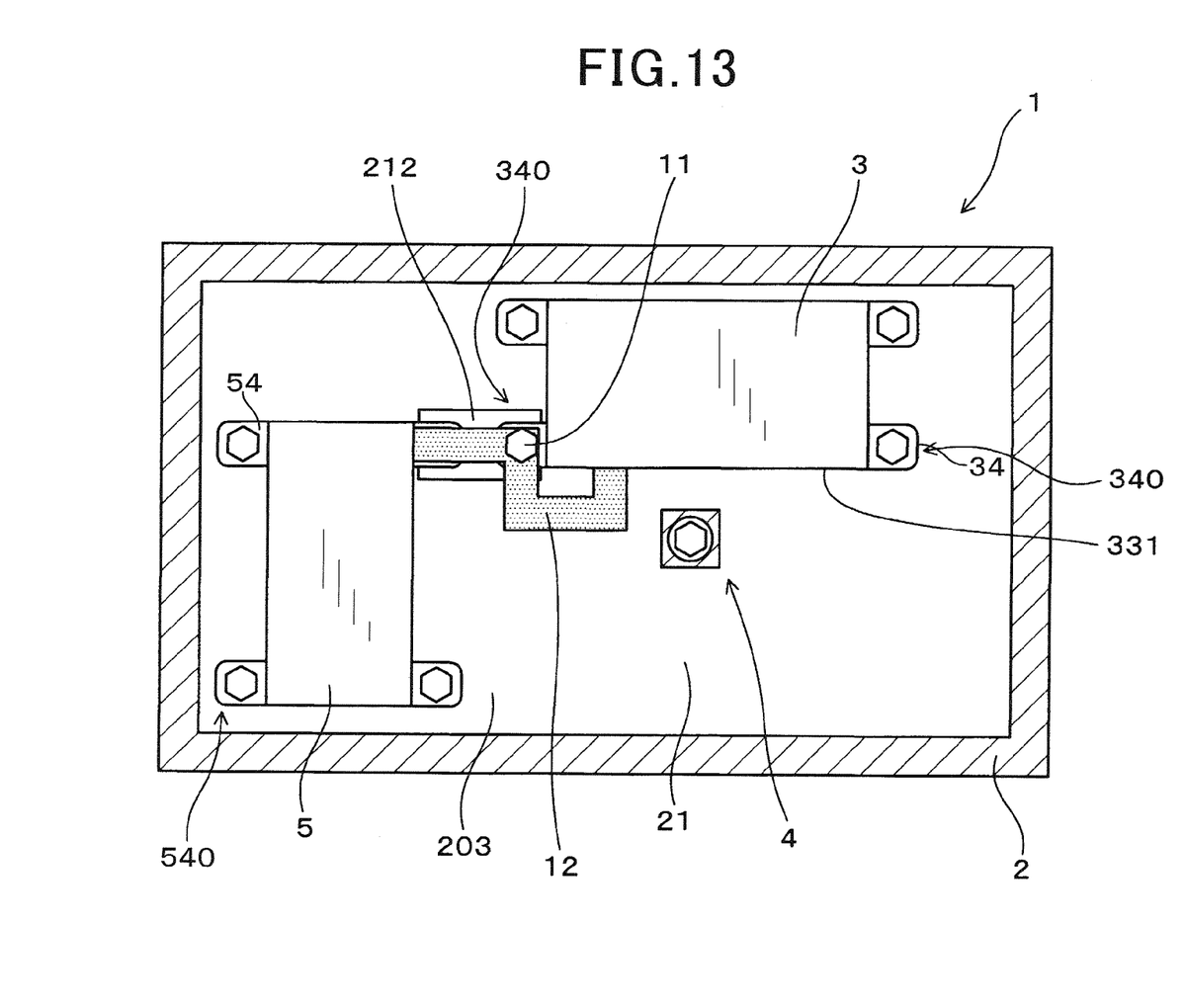
FIG. 13 is a partially sectional plane view which illustrates a power converter according to the tenth embodiment.
Figure 14:
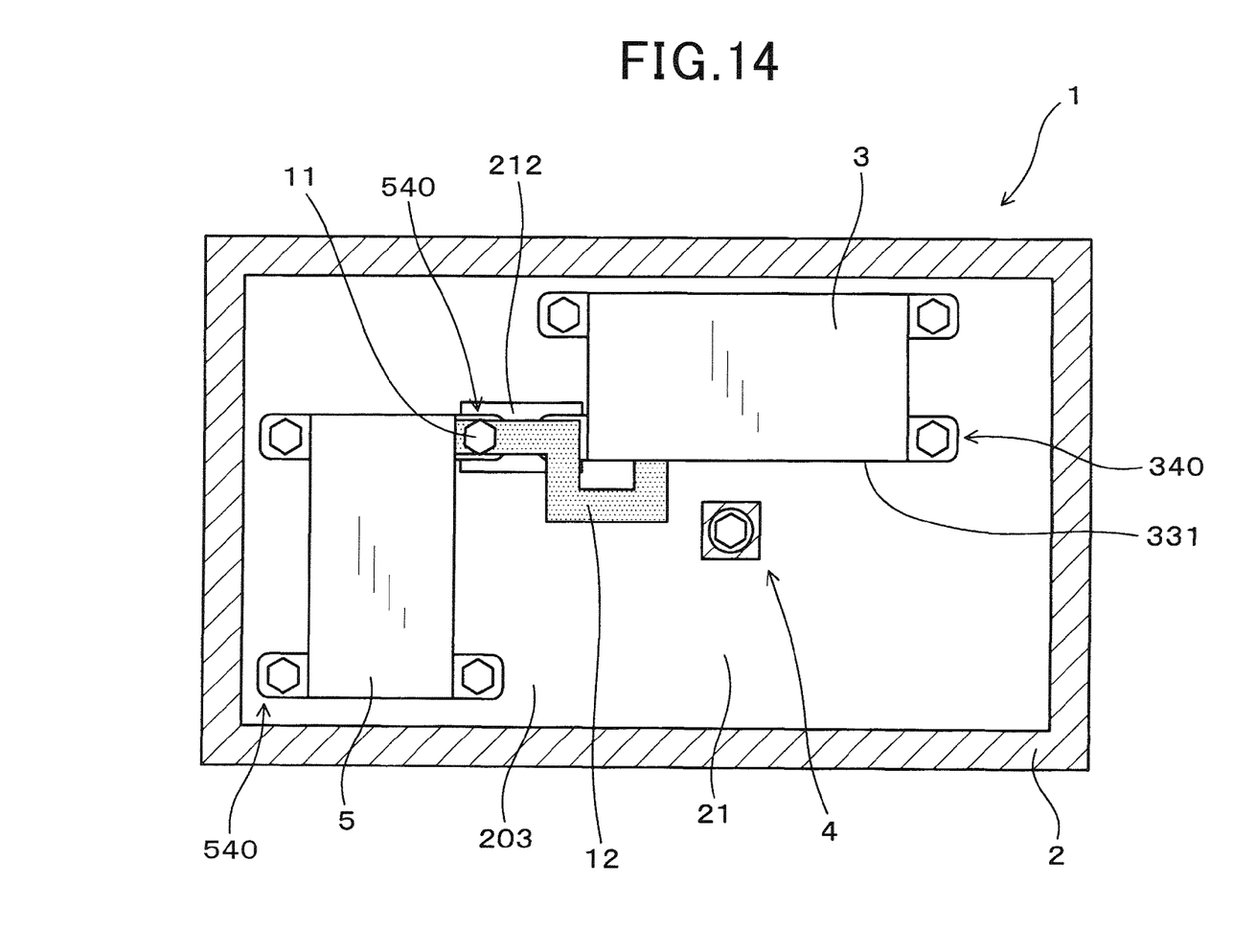
FIG. 14 is a partially sectional plane view which illustrates a modification of the power converter of the tenth embodiment.

In the example illustrated in FIG. 13, one of the joints 340 of the capacitor 3 is secured using the bolt 11 to the base 212 on the bottom plate 21 together with the bus bar 12. In an alternative example in FIG. 14, one of the joints 540 of the noise filter 5 is secured using the bolt 11 to the base 212 on the bottom plate 21 together with the bus bar 12.

Although not illustrated in the drawings, the bus bar 12 is fastened to the bottom plate 21 along with both one of the joints 540 and one of the joints 340.

Other arrangements are identical with those in the ninth embodiment. The same reference numbers, as employed in the ninth embodiment, refer to the same parts, and explanation thereof in detail is omitted here.

The structure of the power converter 1 in the tenth embodiment works to suppress the vibration of the bus bar 12 acting on the capacitor 3 and the noise filter 5.

While the present invention has been disclosed in terms of the preferred embodiments in order to facilitate a better understanding thereof, it should be appreciated that the invention can be embodied in various ways without departing from the principle of the invention. Therefore, the invention should be understood to include all possible embodiments and modification to the shown embodiments which can be embodied without departing from the principle of the invention as set forth in the appended claims.

In the eighth to tenth embodiment, the noise filter 5 is illustrated as being one of components of the power converter 1 which is electrically connected to the capacitor 3 through the bus bar 12, but however, another component such as a reactor may alternatively be joined to the capacitor 3.

The positional relation between the first case body 201 and the second case body 202 is not limited to the one illustrated in the drawings. The bottom plate 21 is not necessarily disposed beneath the top plate 22. For example, the bottom plate 21 may be located above the top plate 22 or so arranged as to face the top plate 22 in the horizontal direction.

The potting surface 331 is, as described above, defined by one of the outer surfaces of the capacitor 3 which is the greatest in area, thereby resulting in a decrease in planar area of the bottom plate 21 occupied by the capacitor 3, which allows the power converter 1 to be reduced in size thereof. For instance, in the case where the capacitor 3 is of a cuboid shape, the capacitor 3 will have three pairs of opposed surfaces. The potting surface 331 is, therefore, defined by either of the opposed surfaces which are the widest in area among the three pairs. The opposed surfaces of each of the three pairs may be slightly different in area from each other. However, in the case where the capacitor is substantially cuboid, the opposed surfaces may be viewed to be equal in area with each other, meaning that either of the opposed surfaces may be defined as being the widest in area.

The electrical connection between the capacitor 3 and the noise filter 5 may be achieved by a conductor other than the bus bar 12.

What is claimed is:

1. A power converter comprising:
a converter casing which is made of an assembly of a first case body and a second case body and has a storage chamber defined therein, the first case body including a bottom plate, the second case body including a top plate which faces the bottom plate, at least one of the first case body and the second case body having side plates which extend from a corresponding one of the bottom plate and the top plate to the other;
a capacitor which is secured to the bottom plate within the storage chamber of the converter casing, the capacitor including a capacitor casing and a capacitor device which is disposed within the capacitor casing and sealed with potting resin so as to have a potting surface through which the potting resin is exposed outside the capacitor casing, the capacitor being fixed on the bottom plate with the potting surface oriented perpendicular to a normal direction of the bottom plate; and
a connector which mechanically connects the bottom plate of the first case body and the top plate of the second case body and is located away from the side plates.

2. A power converter as set forth in claim 1, wherein the potting surface is defined by one of outer surfaces of the capacitor which is the greatest in area.

3. A power converter as set forth in claim 1, wherein the connector is disposed between a plane including the potting surface of the capacitor and one of the side plates which directly faces the potting surface.

4. A power converter as set forth in claim 3, wherein the connector is so located as to face the potting surface of the capacitor.

5. A power converter as set forth in claim 3, wherein the potting surface of the capacitor faces the center of the converter casing in the normal direction of the potting surface.

6. A power converter as set forth in claim 1, wherein the connector lies on a line which passes through a joint of the capacitor to the bottom plate in parallel to the normal direction of the potting surface, as viewed from a normal direction of the bottom plate.

7. A power converter as set forth in claim 1, wherein the connector is partially formed by the capacitor.

8. A power converter as set forth in claim 1, wherein a component of the power converter which is connected to the capacitor through a bus bar is secured to the bottom plate through joints, and wherein the capacitor is secured to the bottom plate through joints, at least one of the joints of the capacitor being fixed to at least one of the joints of the component of the power converter to the bottom plate.

9. A power converter as set forth in claim 8, wherein the at least one of the joints of the capacitor and the least one of the joints of the component of the power converter are both fastened to the bottom plate.

10. A power converter as set forth in claim 8, wherein the at least one of the joints of the capacitor and the least one of the joints of the component of the power converter are both fastened to a base which protrudes from a surface of the bottom plate.

11. A power converter as set forth in claim 8, wherein the bus bar is fastened to the bottom plate along with either or both one of the joints of the capacitor and one of the joints of the component of the power converter.

\* \* \* \* \*